United States Patent [19]

Nishimura

[11] Patent Number: 5,291,050
[45] Date of Patent: Mar. 1, 1994

[54] MOS DEVICE HAVING REDUCED GATE-TO-DRAIN CAPACITANCE

[75] Inventor: Takeyoshi Nishimura, Matsumoto, Japan

[73] Assignee: Fuji Electric Co., Ltd., Tanabeshinden, Japan

[21] Appl. No.: 780,222

[22] Filed: Oct. 22, 1991

[30] Foreign Application Priority Data

Oct. 31, 1990 [JP] Japan ............................... 2-294525

[51] Int. Cl.$^5$ ................. H01L 29/76; H01L 29/94; H01L 31/062; H01L 31/113
[52] U.S. Cl. ............................. 257/340; 257/335; 257/337; 257/341
[58] Field of Search ................. 357/23.1, 23.4, 59; 257/335, 337, 341, 340

[56] References Cited

U.S. PATENT DOCUMENTS

| | | | |
|---|---|---|---|
| 4,831,424 | 5/1989 | Yoshida et al. | 357/23.4 |
| 4,901,124 | 2/1990 | Seki | 357/23.4 |
| 4,963,970 | 10/1990 | Throngnumchai et al. | 357/23.4 |

FOREIGN PATENT DOCUMENTS

| | | | |
|---|---|---|---|
| 55-56663 | 4/1980 | Japan | 357/23.4 |
| 62-46570 | 2/1987 | Japan | 357/23.4 |
| 62-47163 | 2/1987 | Japan | 357/23.4 |
| 1-295465 | 11/1989 | Japan | 357/23.4 |
| 2122420 | 7/1986 | United Kingdom | 357/23.4 |

Primary Examiner—Rolf Hille
Assistant Examiner—Steven Loke
Attorney, Agent, or Firm—Brumbaugh, Graves, Donohue & Raymond

[57] ABSTRACT

A metal-oxide-semiconductor (MOS) device designed to achieve reduced gate-to-drain capacitance is disclosed. The device has gate-electrode layer consisting of alternating polarity regions, such that regions of the gate-electrode layer not involved in channel operations have a conductivity type different from the conductivity type of the gate-electrode-layer regions actually involved in channel operations. Since the alternating conductivity regions form a capacitance in series to the gate-to-drain capacitance, the gate-to-drain capacitance of the device is reduced. An embodiment of the invention also incorporates increased-thickness regions of the gate-oxide film, which regions are disposed over semiconductor areas at which no channel operation occurs.

6 Claims, 4 Drawing Sheets

MOS DEVICE HAVING REDUCED GATE-TO-DRAIN CAPACITANCE

FIELD OF THE INVENTION

The present invention relates to a metal-oxide-semiconductor (MOS) device with reduced gate-to-drain capacitance.

BACKGROUND OF THE INVENTION

In using metal-oxide-semiconductor (MOS) structures for switching operations involving power supplies and AC adapters, it is desirable to reduce the gate-to-drain capacitance in order to reduce switching time and power loss.

Reduction of capacitance across gate and drain may be achieved by several methods, including: reducing the ratio of the gate width to the width of the channel region; decreasing the gate area; increasing the thickness of the gate insulation film; increasing the thickness of a part of the insulation film; and disposing an impurity diffusion layer whose conductivity type is different from that of the substrate, on a portion of the surface of the semiconductor substrate away from the channel region.

FIG. 2 shows a cross-section of a conventional MOS structure for reducing the gate-to-drain capacitance. In this embodiment incorporating a reduced gate area, p-type channel regions (2) are formed on the surface of an n-type silicon substrate (1); p+-type regions (3), laterally interposed between regions (2), are formed on the surface of substrate (1); and n+ source regions (4) are formed on the surface portions of regions (2). Additionally, lateral spacing between the channel regions (2) is reduced.

In the embodiment of FIG. 2, gate electrodes (6) made of polycrystal silicon film are disposed on gate oxide films (5), which layer is in turn disposed on portions of the channel regions (2) located between the source regions (4) and the n-type substrate (1). The gate electrodes (6), via gate oxide films (5), are disposed also on portions of the n-type substrate between the channel regions (2). An Al—Si source electrode (7) contacts the p+ region (3) and the n+ source region (4). Additionally, the source electrode (7) is insulated by PSG films (8) from the channel regions (2) and the n-type substrate (1).

The embodiment of FIG. 2 has an operational problem. When the gate electrode (6) area is reduced in order to decrease the gate-to-drain capacitance, on-resistance of the device increases.

FIG. 3 illustrates another conventional MOS structure for reducing the gate-to-drain capacitance. In this embodiment, which has a structure similar to FIG. 2, the gate-oxide-film (5) thickness is increased while lateral spacing between the channel regions (2) is not reduced.

This embodiment also has an operational problem. Increase in the thickness of the gate-oxide film (5) results in changes of the threshold voltage, $V_{th}$, and mutual conductance, $g_{fs}$. Consequently, when the applied voltage is zero, the gate-to-drain capacitance is initially reduced. However, since the gate-to-drain capacitance is determined by the capacitance of the depletion layer generated in the substrate (1), as the applied voltage increases the gate-to-drain capacitance similarly increases. The net effect is that the gate-to-drain capacitance remains unchanged, as if the gate-oxide-film thickness had not been increased.

FIG. 4 illustrates another conventional MOS structure for reducing the gate-to-drain capacitance. In this embodiment, region (51) of the gate oxide film (5) is thicker than the rest of the oxide film (5). As in the structure of FIG. 3, the structure of FIG. 4 cannot effectuate reduced gate-to-drain capacitance.

FIG. 5 illustrates yet another conventional MOS structure for reducing the gate-to-drain capacitance. In this embodiment, p-type diffusion regions (9) are formed underneath the gate electrodes (6) on the surface portion of the n substrate (1). Capacitance between the gate and the drain in the impurity diffusion region is negligible. Consequently, capacitance of the structure is decreased due to reduction of capacitance between the gate and the drain. However, due to reduced area of the n-type substrate (1) interposed between the channel regions (2), junction-FET effect occurs. This phenomenon results in a problem of increased on-resistance, $R_{DS}(on)$

SUMMARY OF THE INVENTION

It is an object of the present invention to solve the above problems by providing a MOS device with improved switching characteristics, which characteristics are achieved via reduction of the gate-to-drain capacitance without affecting the MOS device's electrical characteristics.

More specifically, in order to solve the above problems, the present invention provides a MOS device comprising: a plurality of second regions of a second conductive type formed on the surface portion of a first layer region of a first conductive type, said second regions each having a third region of the first conductive type formed on its surface; a polycrystal-silicon-film gate-electrode layer disposed on insulation films over the surface portions of the first region and the second region; wherein portions of the gate electrode disposed over the exposed surface portions of the first region, which surface portions are interposed between two adjacent second regions, have a conductivity type different from the conductivity type of the gate electrode portions disposed over the surface portions of the first layer region not interposed between two adjacent second regions. Since the alternating conductivity regions of the gate-electrode layer generate capacitance in series with the gate-to-drain capacitance, the overall gate-to-drain capacitance is reduced. Moreover, device characteristics are unaffected since the portion of the gate-electrode layer disposed over portion of the first region and not interposed between two adjacent second regions does not affect channel operation.

In order to form the portions of the gate-electrode layer having a conductivity type different from the portions of the gate-electrode layer disposed over the surface portions of the first region interposed between two adjacent second regions, the present invention utilizes ion implantation at a dose of $10^{11}$–$10^{13}$/cm$^2$.

Another means provided by the present invention to solve the aforementioned problems includes increasing the insulation-film thickness of the portions disposed over the first region in comparison to the insulation-film thickness of the portions disposed over the second region.

DETAILED DESCRIPTION OF THE PREFERRED EMBODIMENTS

Figure 1A:
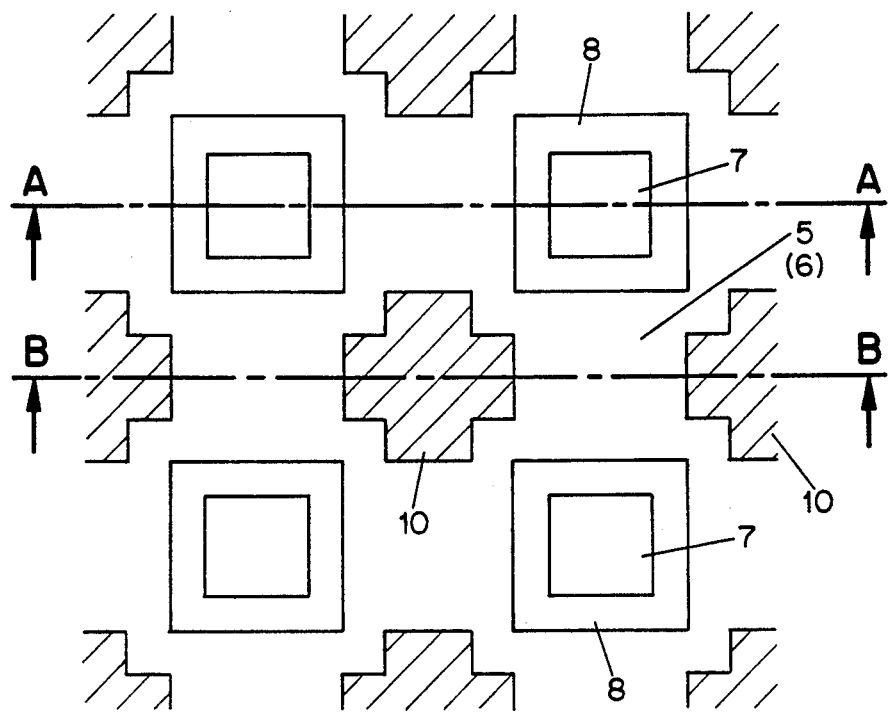
FIG. 1(a) shows a plan view of a MOS device according to a preferred first embodiment of the present invention.
Figure 1B:
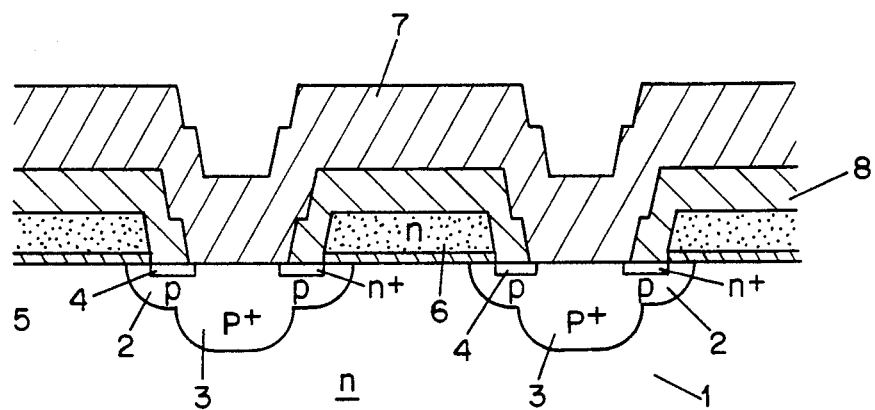
FIG. 1(b) shows a cross-section, along the A—A line shown in FIG. 1(a), of a MOS device according to the first embodiment of the present invention.

In the first embodiment of the present invention, shown in FIG. 1, p+-type regions (3) are formed on the first surface of an n-type layer (1). In addition, n+-type regions (4) are formed on the first surface of the p+-type regions (3). Insulation film (5) covers the exposed portions of the first surface of the n-type layer (1) and portions of the p+-type regions (3) interposed between the n+-type region (4) and the exposed portions of the first surface of the n-type layer (1).

A polysilicon-gate-electrode layer is disposed via insulation film (5) on the exposed first surface of the n-type semiconductor layer (1). Portions (6) of said gate-electrode layer, disposed over the exposed surface portions of said n-type layer (1) interposed between two adjacent p+-type regions (3), have a conductivity type different from the portions (10) of said gate-electrode layer disposed over the exposed surface portions of said layer (1) not interposed between two adjacent p+-type regions (3). In the plan view of FIG. 1(a), the n-type gate-electrode-layer regions (6) are located between the cross-shaped regions (10), which are p-type regions of the gate-electrode layer.

The n-type gate-electrode-layer region (6) can be formed by doping the polycrystal-silicon film with phosphor or arsenic using the CVD process. The p-type gate-electrode-layer region (10) can be formed by boron ion-implantation at a dose of $10^{11}$ to $10^{13}/cm^2$.

Figure 1C:
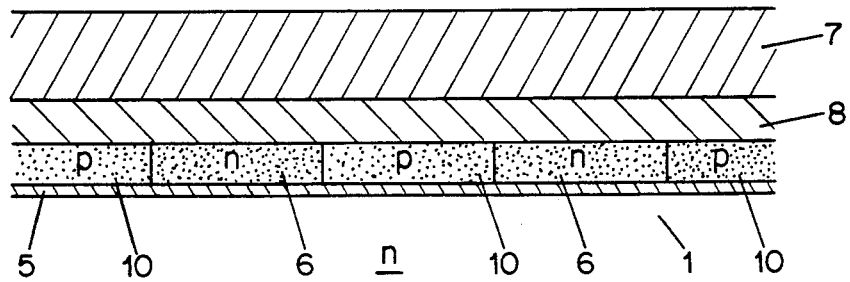
FIG. 1(c) shows a cross-section, along the B—B line shown in FIG. 1(a), of a MOS device according to the first embodiment of the present invention.
Figure 2:
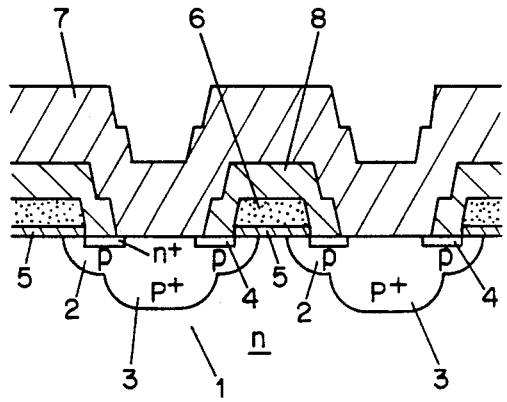
FIG. 2 shows a cross-section of a conventional MOS structure for reducing the gate-to-drain capacitance.
Figure 3:
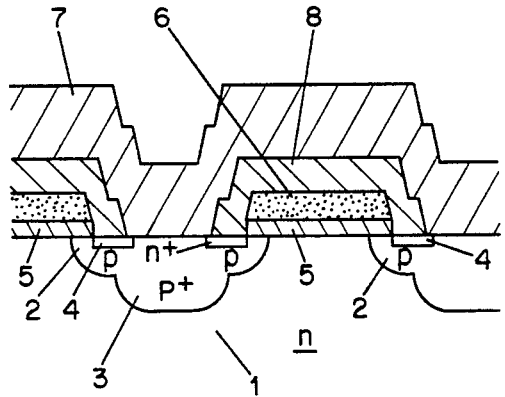
FIG. 3 shows a cross-section of another conventional MOS structure for reducing the gate-to-drain capacitance.
Figure 4:
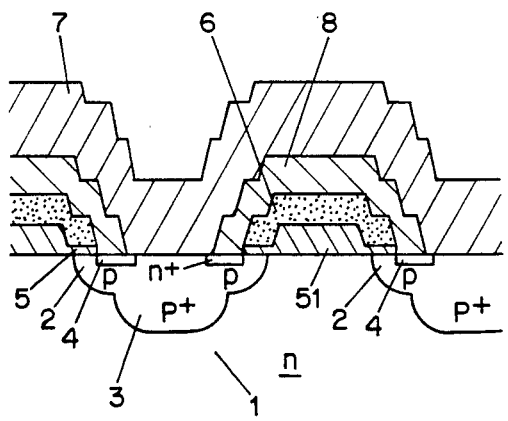
FIG. 4 shows a cross-section of yet another conventional MOS structure for reducing the gate-to-drain capacitance.
Figure 5:
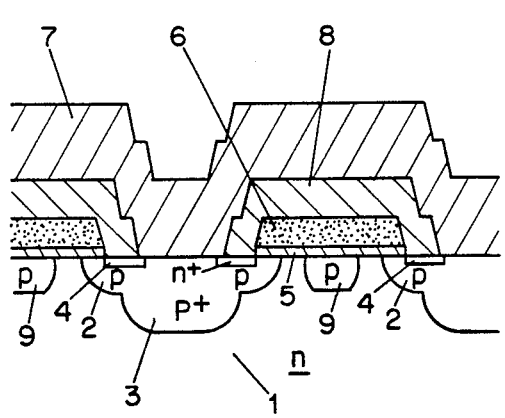
FIG. 5 shows a cross-section of yet another conventional MOS structure for reducing the gate-to-drain capacitance.

In FIG. 1(c), which shows the cross-section of the first embodiment along the "B—B" line of FIG. 1(a), the p-type gate-electrode-layer regions (10) are interposed between the n-type gate-electrode-layer regions (6). Consequently, these regions of alternating polarity create a capacitance in series to the gate-to-drain capacitance.

It is to be understood that the drain electrode is connected to the bottom surface of the MOS device. In a MOSFET, the bottom surface of the device would be the bottom surface of the substrate. In an IGBT, the bottom surface of the device would be the bottom surface of a layer located below the substrate.

Because the capacitance created by the alternating polarity regions of the gate-electrode-layer is in series to the gate-to-drain capacitance, the overall value of the gate-to-drain capacitance is reduced. However, because the p-type gate-electrode-layer region (10) is not involved in the operation of the channel region or the substrate, reduction of the gate-to-drain capacitance is achieved without any increase in the value of the on resistance, $R_{DS}(on)$.

Reduction of gate-to-drain capacitance allows faster on/off switching of MOS devices, such as MOSFETs or IGBTs, and it also reduces switching loss.

Figure 6A:
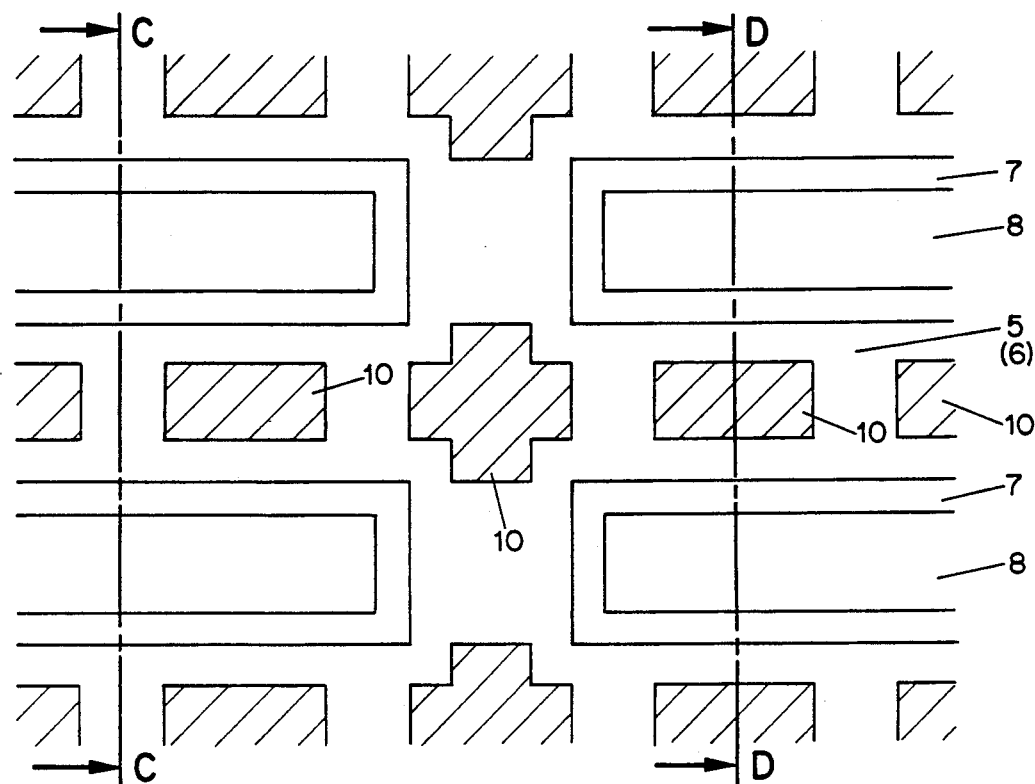
FIG. 6(a) shows a plan view of a MOS device according to a preferred second embodiment of the present invention.
Figure 6B:
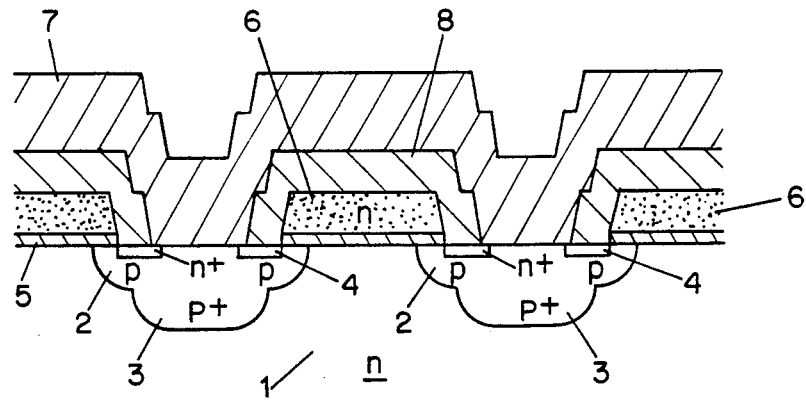
FIG. 6(b) shows a cross-section, along the C—C line shown in FIG. 6(a), of a MOS device according to the second embodiment of the present invention.
Figure 6C:
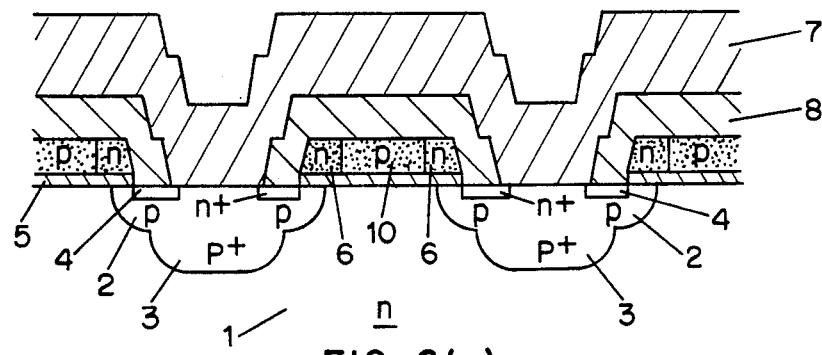
FIG. 6(c) shows a cross-section, along the D—D line shown in FIG. 6(a), of a MOS device according to the second embodiment of the present invention.

FIG. 6 shows various profiles of a MOS device according to a second embodiment of the present invention. In FIG. 6(a), the p+-type regions (3) are rectangularly shaped. Alternating conductivity regions of the gate-electrode layer are disposed along the lengths of two adjacent p+-type regions (3). Consequently, as can be seen in FIG. 6(c), MOS elements formed along the lengths of the p+-type regions (3) have a gate electrode with n-p-n structure.

Figure 7A:
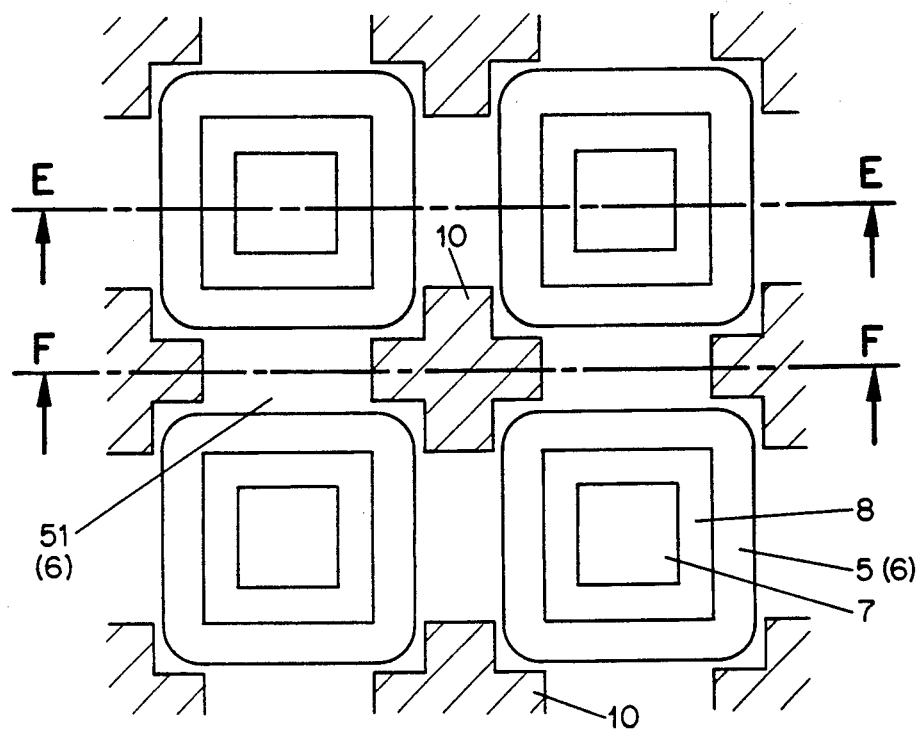
FIG. 7(a) shows a plan view of a MOS device according to a preferred third embodiment of the present invention.

FIG. 7 shows various profiles of a third embodiment of the present invention. This embodiment has a similar plan-view layout as the embodiment of FIG. 1.

Figure 7B:
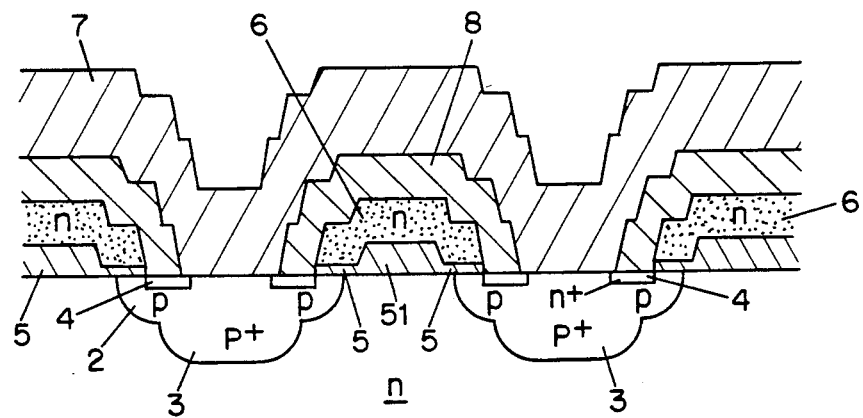
FIG. 7(b) shows a cross-section, along the E—E line shown in FIG. 7(a), of a MOS device according to the third embodiment of the present invention.
Figure 7C:
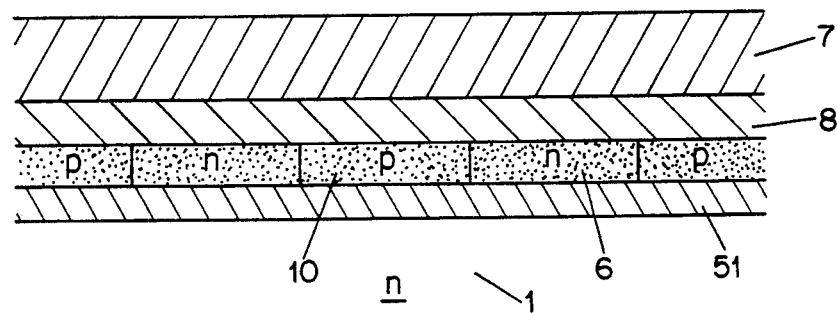
FIG. 7(c) shows a cross-section, along the F—F line shown in FIG. 7(a), of a MOS device according to the third embodiment of the present invention.

However, as can be seem from FIGS. 7(b) and 7(c), portions the gate-oxide film (5) disposed over the channel regions (2) are thinner than other regions of the gate-oxide film. The gate-oxide film over the channel regions has a thickness of 500 to 1,200 Å. Other regions (51) of the gate-oxide film have a thickness of 6,000 Å.

The p-type gate-electrode-layer regions (10) are formed on the thicker oxide film (51). Increasing the insulation-film thickness reduces the gate-to-drain capacitance when the applied voltage is zero. Moreover, since the oxide-film thickness is increased only in areas where no channel operation occurs, the MOS device's electrical characteristics change very little.

I claim:

1. A metal-oxide-semiconductor device comprising:
    a first semiconductor region of a first conductive type having a first surface and a second surface;
    a plurality of second regions of a second conductive type at said first surface of said first semiconductor region;
    a third region of said first conductive type in each of said second regions;
    whereby a plurality of channel regions are formed between said third region and said first surface of said first semiconductor region; and
    a gate-electrode layer disposed on an insulation film over said channel regions and said first surface of said first semiconductor region;

wherein said gate-electrode layer comprises first and second portions of opposite conductivity type, each one of the first portions extending across a first surface portion of said first semiconductor region, between a first region over a first channel region and a second region over a neighboring second channel region.

2. A device according to claim 1, wherein said second portions of the gate-electrode layer are formed by ion implantation at a dose of $10^{11}$ to $10^{13}/cm^2$.

3. A device according to claim 2, wherein said second regions are substantially square in shape when viewed from the top of the device.

4. A device according to claim 2, wherein said second regions are substantially rectangular in shape when viewed from the top of the device.

5. A device according to claims 1, 2 or 3, wherein the portion of said insulation film disposed over said first surface portions of said first semiconductor region is thicker than the insulation film over said channel regions.

6. A metal-oxide-semiconductor device comprising:
- a first semiconductor region of a first conductive type having a first surface and a second surface;
- a plurality of second regions of a second conductive type at said first surface of said first semiconductor region, said second regions being substantially rectangular in shape;
- a third region of said first conductive type in each of said second regions;
- a plurality of channel regions formed between said third region and said first surface of said first semiconductor region; and
- a gate-electrode layer disposed on an insulation film over said channel regions and first surface portions of said first semiconductor region;

wherein portions of said gate-electrode layer disposed over two adjacent channel regions and interposing first-surface portions of said first semiconductor region having a conductivity type opposite to the conductivity type of other portions of the gate-electrode layer, portions of the gate-electrode layer not disposed over said channel regions and interposing first-surface portions of said first semiconductor region are formed by ion implantation at a dose of $10^{11}$ to $10^{13}/cm^2$, and selected portions of the gate-electrode layer disposed over selected first-surface portions of said first semiconductor region, which surface portions are interposed between longer sides of two adjacent second regions, have a conductivity type opposite to the conductivity type of portions of the gate-electrode layer disposed over said channel regions along longer edge of said channel regions.

* * * * *